United States Patent
Jiang et al.

(10) Patent No.: US 8,507,336 B2
(45) Date of Patent: Aug. 13, 2013

(54) METHOD FOR FORMING METAL GATE AND MOS TRANSISTOR

(75) Inventors: Li Jiang, Shanghai (CN); Mingqi Li, Shanghai (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 296 days.

(21) Appl. No.: 13/176,678

(22) Filed: Jul. 5, 2011

(65) Prior Publication Data

US 2012/0142150 A1    Jun. 7, 2012

(30) Foreign Application Priority Data

Dec. 2, 2010    (CN) .......................... 2010 1 0571163

(51) Int. Cl.
*H01L 21/336* (2006.01)
*H01L 21/28* (2006.01)

(52) U.S. Cl.
USPC    438/197; 438/591; 257/E21.19; 257/E21.409

(58) Field of Classification Search
None
See application file for complete search history.

(56) References Cited

U.S. PATENT DOCUMENTS

| | | | | |
|---|---|---|---|---|
| 7,494,868 B2* | 2/2009 | Choi et al. | ..................... | 438/257 |
| 8,003,467 B2* | 8/2011 | Ng et al. | ........................ | 438/285 |
| 2005/0051854 A1* | 3/2005 | Cabral et al. | ................... | 257/407 |
| 2008/0248621 A1* | 10/2008 | Kai et al. | ........................ | 438/257 |
| 2009/0149012 A1* | 6/2009 | Brask et al. | ................... | 438/595 |
| 2010/0109088 A1 | 5/2010 | Ng et al. | | |
| 2012/0171854 A1* | 7/2012 | He et al. | ........................ | 438/591 |
| 2013/0157449 A1* | 6/2013 | Cao et al. | ....................... | 438/585 |

* cited by examiner

*Primary Examiner* — Seahvosh Nikmanesh
(74) *Attorney, Agent, or Firm* — Anova Law Group, PLLC

(57) ABSTRACT

The invention provides a method for forming a metal gate and a method for forming a MOS transistor. The method for forming a metal gate includes: providing a substrate; forming a sacrificial oxide layer and a polysilicon gate on the substrate; forming a silicon oxide layer on sidewalls of the sacrificial oxide layer and the polysilicon gate; forming a stop layer that covers the substrate; removing a part of the stop layer in the spacers; forming a second interlayer dielectric layer that covers the first interlayer dielectric layer, the spacers and the polysilicon gate; polishing the second interlayer dielectric layer to expose the spacers and the polysilicon gate; removing the polysilicon gate to form a trench; removing the sacrificial oxide layer in the trench; and forming a metal gate in the trench. The invention prevents from recesses and therefore metal bridge and metal residuals in the recesses.

19 Claims, 9 Drawing Sheets

METHOD FOR FORMING METAL GATE AND MOS TRANSISTOR

CROSS REFERENCE TO RELATED APPLICATIONS

The present application claims the priority of Chinese Patent Application No. 201010571163.7, entitled "METAL GATE AND METHOD FOR FORMING MOS TRANSISTOR", and filed Dec. 2, 2010, the entire disclosure of which is incorporated herein by reference.

BACKGROUND OF THE INVENTION

1. Field of the Invention

The present invention generally relates to the field of semiconductor manufacture, and particularly to a method for forming a metal gate and a method for forming a MOS transistor.

2. Description of Prior Art

In the wake of an ever increasing integration level of semiconductor devices, in a mainstream method for fabricating MOS transistor for advanced semiconductor device, a gate dielectric layer includes high k material with dielectric constant of no less than 10, and a metal gate includes metal material. When a metal gate is formed on a high k gate dielectric layer, a step of polishing interlayer dielectric layer (ILD) is needed before removing a polysilicon gate, which is used as a dummy gate. This step may impact performance of the metal gate formed in a subsequent step. Thus, chemical mechanical polishing (CMP) of ILD is critical. A conventional method for forming a metal gate is disclosed in, for example US Pat. publication No. 20100109088, and comprises: defining an active region with shallow trench isolations on a substrate, defining a pFET active region with a hard mask, and etching the pFET active region. At a region exempt from etching, a SiGe layer grows to be substantially flush with the substrate. The hard mask is removed to form a gate material layer on the substrate. The gate material layer is patterned to form a metal gate stack. Ions are implanted into the active region to form metal gate stack spacers. A source and a drain are respectively formed on the substrate.

FIGS. 1-6 exemplarily show a conventional method for forming a metal gate.

As shown in FIG. 1, a sacrificial oxide layer 2 and a polysilicon gate 3 are respectively formed on the substrate 1 in sequence. A silicon oxide layer 4 is formed on the substrate 1 and on sidewalls of the sacrificial oxide layer 2 and the polysilicon gate 3. A stop layer 5 is formed on the substrate 1 and covers the silicon oxide layer 4 and the polysilicon gate 3. An interlayer dielectric layer 6 is formed on the stop layer 5.

As shown in FIG. 2, the interlayer dielectric layer 6 is polished by a CMP process for exposing the stop layer 5 on the polysilicon gate 3.

As shown in FIG. 3, the interlayer dielectric layer 6 and the stop layer 5 are polished by CMP process for exposing the polysilicon gate 3. In one embodiment, slurry is chosen in such a way that removal rate of the interlayer dielectric layer 6 is larger than removal rate of the stop layer 5. When the polysilicon gate 3 is exposed, the stop layer 5 is substantially flush with the polysilicon gate 3, and the interlayer dielectric layer 6 is lower than the stop layer 5.

As shown in FIG. 4, the polysilicon gate 3 is removed to expose the sacrificial oxide layer 2. The sacrificial oxide layer 2 is removed for exposing the substrate 1 and forming a trench (not labeled). A metal layer is formed on the interlayer dielectric layer 6, and is filled into the trench. The metal layer is polished for forming the metal gate 8 in the trench. Referring to FIG. 4, the interlayer dielectric layer 6 is lower than the stop layer 5. Metal residuals are remained on the interlayer dielectric layer 6 after formation of the metal gate 8. Shortcut may occur, resulting in deterioration of performance.

As shown in FIG. 5, slurry is chosen so that removal rate on the stop layer 5 is larger than that on the interlayer dielectric layer 6. Especially in a device-intensive region, when the interlayer dielectric layer 6 is polished to such a height that the stop layer 5, the silicon oxide layer 4 and the polysilicon gate 3 are all lower than the interlayer dielectric layer 6, undesired recesses 7 may be formed.

As shown in FIG. 6, during formation of the metal gate 8, the recesses 7 are filled with metal, resulting in metal bridge and metal residuals. Shortcut may occur, tending to cause deterioration of electrical performance.

SUMMARY OF THE INVENTION

Embodiments of the present invention provide a method for forming a metal gate and a method for forming a MOS transistor, which prevent from metal bridge and metal residuals, and correspondingly avoiding deterioration of electric performance and reliability of a semiconductor device.

In an embodiment, a method for forming a metal gate includes:

providing a substrate;

forming a sacrificial oxide layer and a polysilicon gate respectively on the substrate in sequence;

forming a silicon oxide layer on sidewalls of the sacrificial oxide layer and the polysilicon gate;

forming a stop layer that covers the substrate, the silicon oxide layer and the polysilicon gate, the stop layer having a first part parallel to the substrate, said first part being on the silicon oxide layer and the polysilicon gate, and a second part on the sidewall of the silicon oxide layer, the second part of the stop layer and the silicon oxide layer together constituting spacers;

forming a first interlayer dielectric layer on the stop layer that covers the spacers and the polysilicon gate;

polishing the first interlayer dielectric layer for exposing the stop layer;

removing the first part of the stop layer on the spacers and the polysilicon gate;

removing a predetermined thickness of the second part of the stop layer in the spacers, the predetermined thickness corresponding to thickness of the sacrificial oxide layer;

forming a second interlayer dielectric layer that covers the first interlayer dielectric layer, the spacers and the polysilicon gate;

polishing the second interlayer dielectric layer to expose the spacers and the polysilicon gate so as to form a third interlayer dielectric layer which includes the first interlayer dielectric layer and the residual second interlayer dielectric layer, the third interlayer dielectric layer being substantially flush with the silicon oxide layer and the polysilicon gate;

removing the polysilicon gate to form a trench;

removing the sacrificial oxide layer in the trench, a portion of the third interlayer dielectric layer and a portion of the silicon oxide layer so that the residual third interlayer dielectric layer and the residual silicon oxide layer are substantially flush with the stop layer in the spacers; and forming a metal gate in the trench.

Optionally, the first interlayer dielectric layer, the second interlayer dielectric layer and the third interlayer dielectric layer are polished by a CMP process.

Optionally, a slurry used in the CMP process comprises $CeO_2$, $MnO_2$, $ZrO_2$, $Al_2O_3$ or $SiO_2$.

Optionally, the predetermined thickness of the second part of the stop layer is removed by dry etching or wet etching.

Optionally, the stop layer includes silicon nitride.

Optionally, in wet etching, thick phosphoric acid has 85% concentration, etch rate is ranged of 500 Å/min-1500 Å/min, and removal rate ratio of the silicon nitride relative to the silicon oxide is larger than 50:1.

Optionally, gases in dry etching comprise H, F and C.

Optionally, the gases comprise at least one of $CHF_3$, $CH_2F_2$ and $CH_3F$, etching rate is ranged of 100 Å/min-500 Å/min, and removal rate ratio of the silicon nitride relative to the silicon oxide is ranged from 3:1 to 6:1.

Optionally, the first interlayer dielectric layer and the second interlayer dielectric layer include oxide containing silicon.

Optionally, the first interlayer dielectric layer and the second interlayer dielectric layer are formed by high density plasma (HDP) growth or high aspect ratio process (HARP) growth.

Optionally, the sacrificial oxide layer includes oxide containing silicon.

Optionally, the sacrificial oxide layer is formed by tube hot oxidation.

Optionally, the metal layer has material selected from at least one of aluminum, copper, nickel, chromium, tungsten, titanium, titanium tungsten, tantalum and platinum nickel.

Optionally, the method further comprises: before forming a metal gate, forming a gate dielectric layer on the substrate in the trench by CMP process.

Optionally, the gate dielectric layer includes high k material.

Optionally, the high k material of the gate dielectric layer comprises at least one of HfSiO, HfZrO, HfLaO and $HfO_2$.

In another embodiment, a method for forming a MOS transistor includes:

providing a substrate;

forming a sacrificial oxide layer and a polysilicon gate respectively on the substrate in sequence;

forming a silicon oxide layer on sidewalls of the sacrificial oxide layer and the polysilicon gate;

forming a stop layer that covers the substrate, the silicon oxide layer and the polysilicon gate, and having a first part parallel to the substrate, said first part being on the silicon oxide layer and the polysilicon gate, and a second part on the sidewalls of the silicone oxide layer, the second part of the stop layer and the silicon oxide layer constituting spacers;

forming a source in the substrate at one of the spacers and a drain in the substrate at another of the spacers;

forming a first interlayer dielectric layer on the stop layer for covering the spacers and the polysilicon gate;

polishing the first interlayer dielectric layer for exposing the stop layer;

removing the first part of the stop layer on the spacers and the polysilicon gate;

removing a predetermined thickness of the second part of the stop layer in the spacers, the predetermined thickness corresponding to thickness of the sacrificial oxide layer;

forming a second interlayer dielectric layer that covers the first interlayer dielectric layer for covering the spacers and the polysilicon gate;

polishing the second interlayer dielectric layer to expose the spacers and the polysilicon gate so as to form a third interlayer dielectric layer which includes the first interlayer dielectric layer and the residual second interlayer dielectric layer, the third interlayer dielectric layer being substantially flush with the silicon oxide layer and the polysilicon gate;

removing the polysilicon gate to form a trench;

removing the sacrificial oxide layer in the trench, a portion of the third interlayer dielectric layer and a portion of the silicon oxide layer so that third interlayer dielectric layer and the silicon oxide layer are substantially flush with the stop layer in the spacers; and forming a metal gate in the trench.

Compared with the prior art, the embodiments provided by the invention have the advantages below.

In the present invention, before removing the polysilicon gate, a first part of the stop layer parallel to the substrate on the spacers and the polysilicon gate is removed. A predetermined thickness of the second part of the stop layer in the spacers is removed. The predetermined thickness corresponds to the thickness of the sacrificial oxide layer. A second interlayer dielectric layer is formed on the first interlayer dielectric layer that covers the spacers and the polysilicon gate. The second interlayer dielectric layer is polished to expose the polysilicon gate. The polysilicon gate and the sacrificial oxide layer are removed. The second interlayer dielectric layer is substantially flush with the silicon oxide layer in the spacers and the polysilicon gate. In a subsequent process, the metal layer is polished by CMP process to form a metal gate. The metal layer is not remained in the interlayer dielectric layer. Recesses, and therefore metal bridge and metal residuals in the recesses, are avoided. Correspondingly, shortcut is avoided effectively, and electric performance and reliability is promoted.

DETAILED DESCRIPTION OF THE EMBODIMENTS

In a conventional method for forming a metal gate, a founding is observed that, when a chemical mechanical polishing (CMP) process is performed on an interlayer dielectric layer, silicon oxide, polysilicon and silicon nitride are all polished together. These materials are of different compositions, removal rates of the slurry on theses materials are different, correspondingly. For example, removal rate on the silicon nitride is higher than that on the silicon oxide, or removal rate on the silicon oxide is higher than that on the silicon nitride. In this way, it is difficult to polish the interlayer dielectric layer and the spacers to be substantially flush with the polysilicon gate. After polishing, the interlayer dielectric layer is lower than the stop layer, remaining metal on the interlayer dielectric layer. Otherwise, the stop layer is lower than the interlayer dielectric layer, and recesses may be formed on the device-intensive region when a metal layer is filled in the recesses. This way may introduce any deficiencies, such as metal bridge or even shortcut. A technical solution is proposed in this invention after detailed analysis and research to address the problem.

Figure 1:
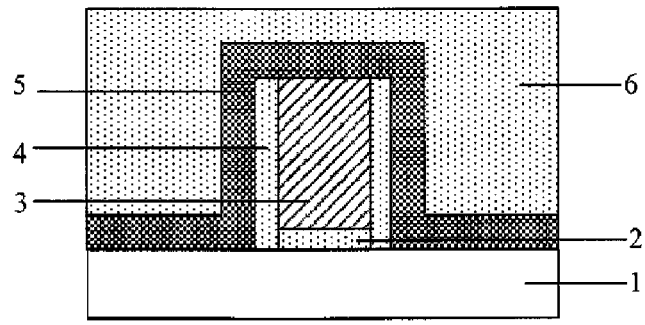
FIGS. 1-6 are cross-sectional views of intermediate structures of a metal gate, illustrating a conventional method for forming the metal gate.
Figure 2:
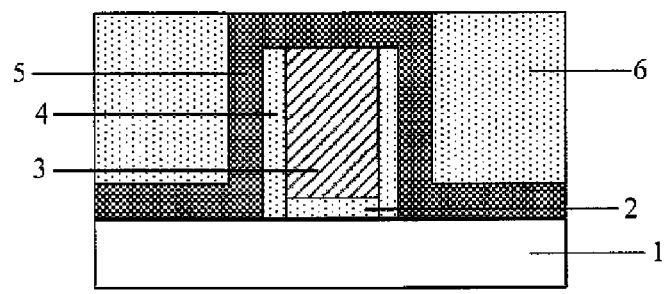
Figure 3:
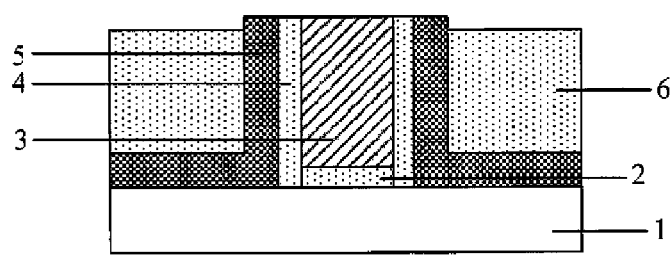
Figure 4:
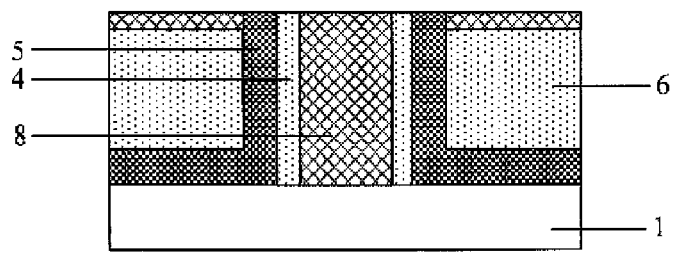
Figure 5:
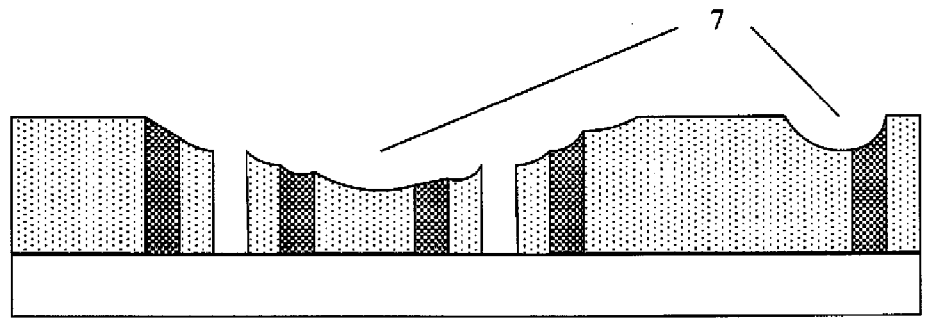
Figure 6:
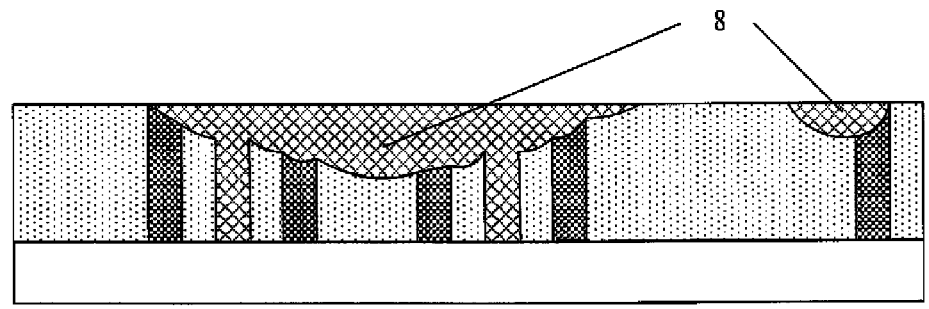
Figure 7:
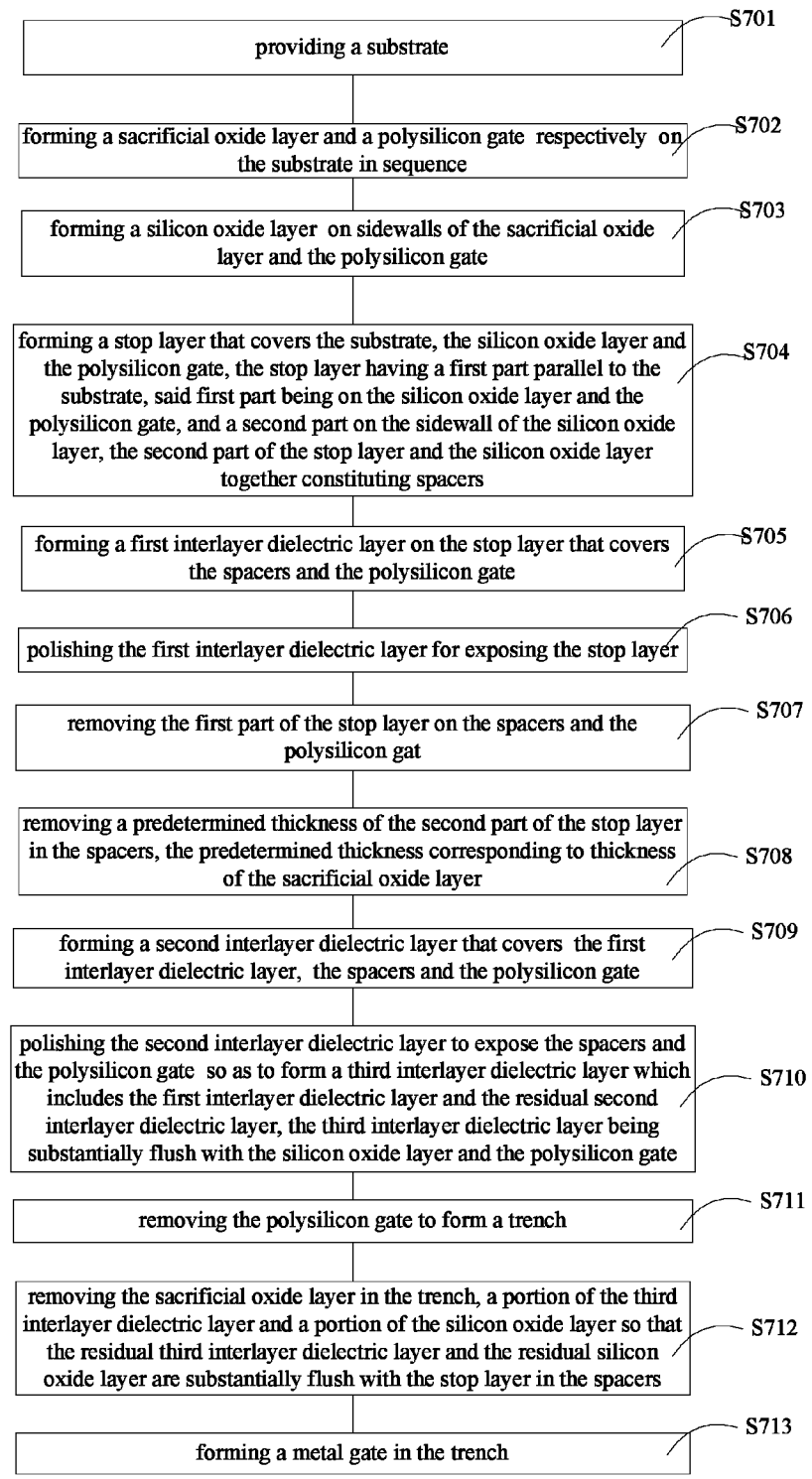
FIG. 7 is a flow chart of a method for forming a metal gate according to an embodiment of the present invention.

FIG. 7 shows a flow chart of a method for forming a MOS transistor according to an embodiment of the present invention. The method comprises:

S701: providing a substrate.

S702: forming a sacrificial oxide layer and a polysilicon gate respectively on the substrate in sequence.

S703: forming a silicon oxide layer on sidewalls of the sacrificial oxide layer and the polysilicon gate.

S704: forming a stop layer that covers substrate, the silicon oxide layer and the polysilicon gate, the stop layer having a first part parallel to the substrate, said first part being on the silicon oxide layer and the polysilicon gate, and a second part on the sidewall of the silicon oxide layer, the second part of the stop layer and the silicon oxide layer together constituting spacers.

S705: forming a first interlayer dielectric layer on the stop layer that covers the spacers and the polysilicon gate.

S706: polishing the first interlayer dielectric layer for exposing the stop layer.

S707: removing the first part of the stop layer on the spacers and the polysilicon gate.

S708: removing a predetermined thickness of the second part of the stop layer in the spacers, the predetermined thickness corresponding to thickness of the sacrificial oxide layer.

S709: forming a second interlayer dielectric layer that covers the first interlayer dielectric layer, the spacers and the polysilicon gate.

S710: polishing the second interlayer dielectric layer to expose the spacers and the polysilicon gate so as to form a third interlayer dielectric layer which includes the first interlayer dielectric layer and the residual second interlayer dielectric layer, the third interlayer dielectric layer being substantially flush with the silicon oxide layer and the polysilicon gate.

S711: removing the polysilicon gate to form a trench.

S712: removing the sacrificial oxide layer in the trench, a portion of the third interlayer dielectric layer and a portion of the silicon oxide layer so that the residual third interlayer dielectric layer and the residual silicon oxide layer are substantially flush with the stop layer in the spacers.

S713: forming a metal gate in the trench.

By the present invention, before removing the polysilicon gate, a first part of the stop layer on the spacers and the polysilicon gate is removed. A predetermined thickness of the second part of the stop layer in the spacers is removed. The predetermined thickness corresponds to the thickness of the sacrificial oxide layer. A second interlayer dielectric layer is formed on the first interlayer dielectric layer for covering the spacers and the polysilicon gate. The second interlayer dielectric layer is polished to expose the polysilicon gate. The polysilicon gate and the sacrificial oxide layer are removed. The second interlayer dielectric layer is substantially flush with the silicon oxide layer in the spacers and the polysilicon gate. In a subsequent process, the metal layer is polished by a CMP process to form a metal gate. The metal layer is not remained in the interlayer dielectric layer. Recesses in the stop layer and the silicon oxide layer, and therefore metal bridge and metal residuals in the recesses, are avoided. Correspondingly, shortcut is avoided effectively, and electric performance and reliability is promoted.

In order to clarify the objects, characteristics and advantages of the invention, embodiments of the invention will be interpreted in detail in combination with accompanied drawings.

More examples are provided hereinafter to describe the invention. However, it shall be appreciated by those skilled in the art that alternative ways may be made without deviation from the scope of the invention. Therefore the invention is not limited within the embodiments described here.

Embodiment I

Figure 8:
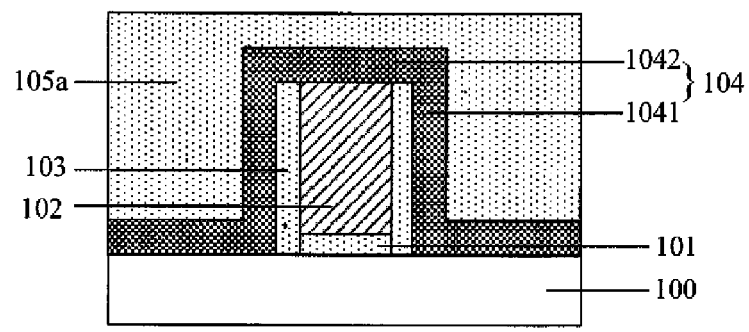
FIGS. 8-15 are cross-sectional views of intermediate structures of a metal gate, illustrating a method for forming the metal gate according to an embodiment of the present invention.

FIGS. 8-15 are cross-sectional views of intermediate structures of a metal gate, illustrating a method for forming the metal gate according to an embodiment of the present invention. As shown in FIG. 8, a substrate 100 is provided. A sacrificial oxide layer 101 and a polysilicon gate 102 are formed on the substrate 100 in sequence. A silicon oxide layer 103 is formed on sidewalls of the polysilicon gate 102 and the sacrificial oxide layer 101. A stop layer 104 is formed on the substrate 100 and covers the silicon oxide layer 103 and the polysilicon gate 102. The stop layer 104 includes a first part 1042 on the silicon oxide layer 103 and the polysilicon gate 102, and a second part 1041 on opposite sides of the polysilicon gate 102. The second part 1041 of the stop layer 104 and the silicon oxide layer 103 constitute spacers. A first interlayer dielectric layer 105a is formed on the stop layer 104 for covering the spacers and the polysilicon gate 102.

In an exemplary embodiment, a sacrificial oxide layer 101 and a polysilicon layer are formed on the substrate 100 in sequence. A first photoresist layer (not shown) is formed on the polysilicon layer, and defines a gate pattern thereon after exposure and development. Taking the first photoresist layer as a mask, the polysilicon layer and the sacrificial oxide layer 101 are etched along the gate pattern to expose the substrate 100 for forming a polysilicon gate 102. A silicon oxide layer 103 is formed on the substrate 100 by CMP process for covering the polysilicon gate 102. The silicon oxide layer 103 is etched to expose the substrate 100. A stop layer 104 is formed on the substrate 100 by CMP process. A first interlayer dielectric layer 105a is formed on the stop layer 104.

In the embodiment, the stop layer 104 includes silicon nitride. The first interlayer dielectric layer 105a includes an oxide containing silicon, and is formed by high density plasma (HDP) growth or high aspect ratio process (HARP) growth.

Figure 9:
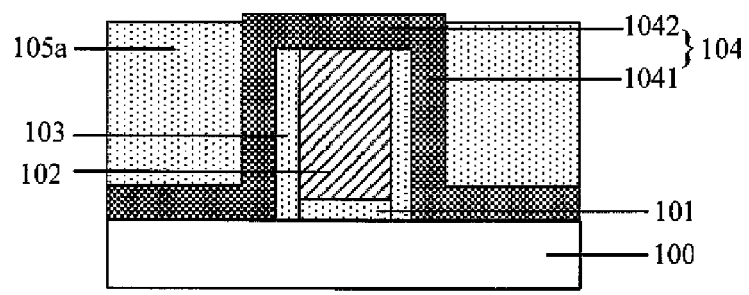

As shown in FIG. 9, the first interlayer dielectric layer 105a is polished by CMP process to expose the first part 1042 of the stop layer 104. Slurry of the CMP process makes removal rate of the first interlayer dielectric layer 105a larger than removal rate of the stop layer 104. In this way, the first interlayer dielectric layer 105a is slightly lower than the first part 1042 of the stop layer 104.

Figure 10:
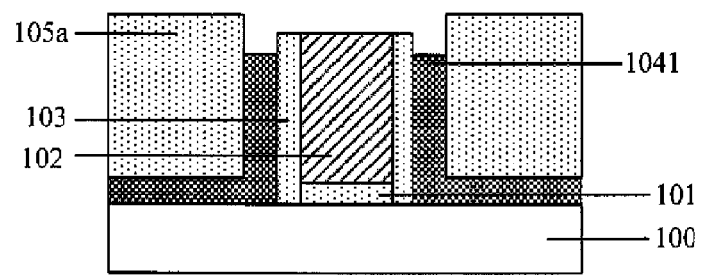

Referring to FIG. 10, the first part 1042 of the stop layer 104 is removed. Further, a predetermined thickness of the second part 1041 of the stop layer 104 is removed. The predetermined thickness is the same as thickness of the sacrificial oxide layer 101.

In the embodiment, a predetermined thickness of the second part 1041 of the stop layer 104 is removed by dry etching or wet etching. In wet etching, thick phosphoric acid with 85% concentration is used. The etch temperature is in a range of 160-170 degree Census, and etch rate is ranged from 500 Å/min to 1500 Å/min. The etching rate ratio of the silicon nitride to the silicon oxide is larger than 50:1. In dry etching, gases contain H, F and C, such as CHF3, CH2F2, CH3F or the like. The etching rate is ranged from 100 Å/min to 500 Å/min. The etching rate ratio of the silicon nitride to the silicon oxide is ranged from 3:1 to 6:1.

Figure 11:
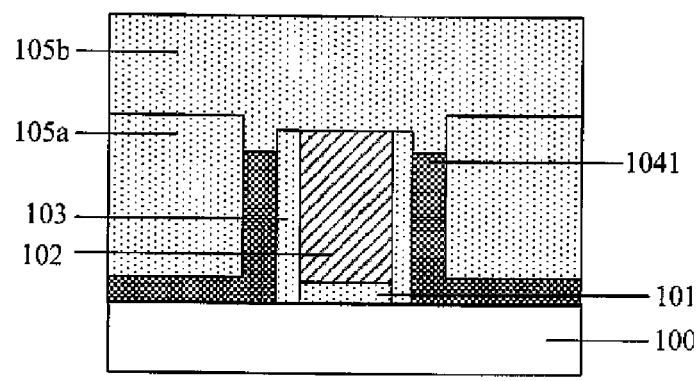

As shown in FIG. 11, a second interlayer dielectric layer 105b is formed on the first interlayer dielectric layer 105a, and covers the spacers and the polysilicon gate 102.

Material and formation method of the second interlayer dielectric layer 105b is the same as that of the first interlayer dielectric layer 105a.

Figure 12:
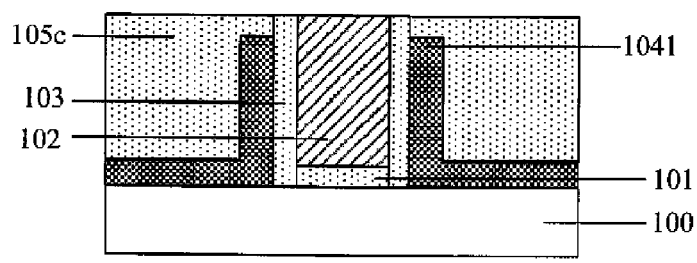

As shown in FIG. 12, the first interlayer dielectric layer 105a and the second interlayer dielectric layer 105b are polished by CMP process to expose the polysilicon gate 102 for forming a third interlayer dielectric layer 105c.

According to one embodiment, in the CMP process of polishing the first interlayer dielectric layer 105a and the second interlayer dielectric layer 105b, slurry has abrasive particles comprising, for example CeO2, MnO2, ZrO2, Al2O3 or SiO2, and the abrasive particles have diameter of 100-500 nanometers. Preferably, the slurry contains CeO2 having diameter ranged from 100-500 nanometers. The slurry containing CeO2 has characteristic of automatical stop on the polysilicon gate. After polishing, loss of the polysilicon gate is less than 50 Å.

Figure 13:
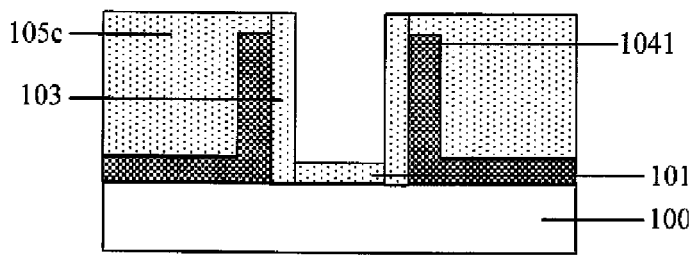

As shown in FIG. 13, the polysilicon gate 102 is removed to expose the sacrificial oxide layer 101 for forming a trench (not labeled).

In the embodiment, the polysilicon gate 102 is removed by dry etching.

Figure 14:
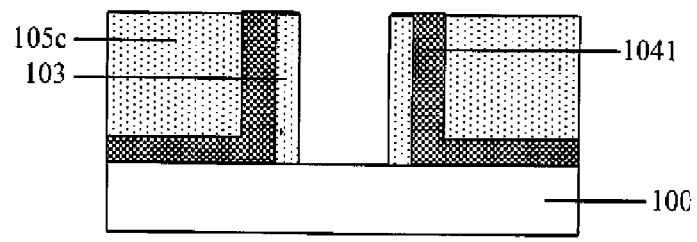

As shown in FIG. 14, the sacrificial oxide layer 101, which is formed in the trench, is removed by wet etching.

In the embodiment, material of the sacrificial oxide layer 101 is the same as or similar to that of the silicon oxide layer 103 and the third interlayer dielectric layer 105c. Therefore, the silicon oxide layer 103 and the third interlayer dielectric layer 105c are respectively removed of the same thickness as thickness of the sacrificial oxide layer 101. When the sacrificial oxide layer 101 is removed, the silicon oxide layer 103 and the third interlayer dielectric layer 105c are substantially flush with the second part 1041 of the stop layer 104.

Figure 15:
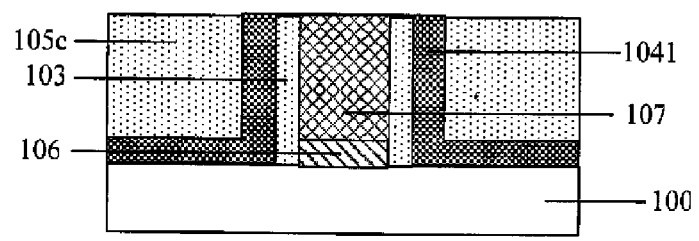

As shown in FIG. 15, a gate dielectric layer 106 and a metal gate 107 are formed in the trench. In one embodiment, a gate dielectric layer 106 is formed on the substrate 100 in the trench by CMP process. A metal layer is formed on the third interlayer dielectric layer 105c and the spacers, and is filled in the trench. The metal layer has material selected from at least one of aluminum, copper, nickel, chromium, tungsten, tungsten, titanium tungsten, tantalum and platinum nickel. The metal layer is polished to expose the third dielectric layer 105c and the spacers for forming the metal gate 107.

In the embodiment, the gate dielectric layer 106 includes high k material which is selected from at least one of HfSiO, HfZrO, HfLaO, HfO$_2$ and any combination thereof. The gate dielectric layer 106 is formed by CVD, LPCVD, PECVD or PVD.

In the embodiment, material of the metal gate 107 is selected from at least one of aluminum, copper, nickel, chromium, titanium, Tungsten Titanium, tantalum and platinum-nickel. The metal gate 107 is formed by a typical deposition process, for example, chemical vapor deposition (CVD), low pressure chemical vapor deposition (LPCVD), plasma enhanced chemical vapor deposition (PECVD), or physical vapor deposition (PVD).

In one embodiment, a diffusion stop layer (not shown) having material of TiN, TaN, TiAl or Ti is formed after formation of the gate dielectric layer 106 for preventing from diffusion of metal ions of the metal gate 107 into the third dielectric layer 105c.

In the embodiment, before removing the polysilicon gate 102, the first part 1042 of the stop layer 104 on the spacers and the polysilicon gate 102 is removed. Further, a predetermined thickness of a second part 1041 of the stop layer 104 is removed. The predetermined thickness corresponds to thickness of the sacrificial oxide layer 101. The second interlayer dielectric layer 105b is formed on the first interlayer dielectric layer 105a for covering the spacers and the polysilicon gate 102. The second interlayer dielectric layer 105b is polished by CMP process to expose the polysilicon gate 102, and form a third interlayer dielectric layer 105c. The sacrificial oxide layer 101 and the polysilicon gate 102 are removed, and the third interlayer dielectric layer 105c is substantially flush with and the second part 1041 of the stop layer 104 and the silicon oxide layer 103. In a subsequent process, the metal layer is polished by CMP process to form a metal gate. The metal layer is not remained in the interlayer dielectric layer. Recesses in the stop layer and the silicon oxide layer, and therefore a part of metal layer in the recesses, are avoided. Correspondingly, shortcut is avoided effectively, and electric performance and reliability is promoted.

Embodiment □

FIGS. 16-24 are cross-sectional views of intermediate structures of a MOS transistor, illustrating a method for forming a MOS transistor according to an embodiment of the present invention.

Figure 16:
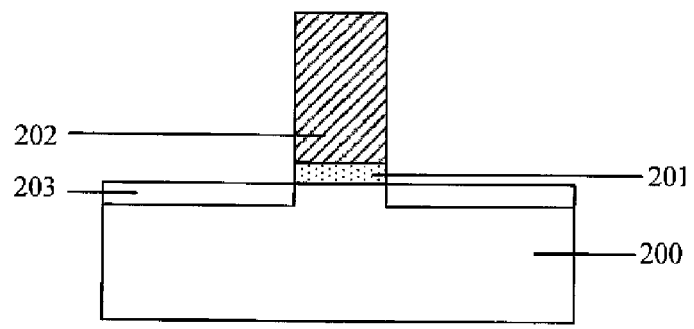
FIGS. 16-24 are cross-sectional views of intermediate structures of a MOS transistor, illustrating a method for forming the MOS transistor according to an embodiment of the present invention.

As shown in FIG. 16, a substrate 200 is provided. A sacrificial oxide layer 201 and a polysilicon gate 202 are formed on the substrate 200 in sequence. A light dopant region 203 is formed in the substrate 200 and at opposite sides of the polysilicon gate 202. In one specific embodiment, a sacrificial oxide layer 201 is formed on the substrate 200 by hot oxidation, for example tube hot oxidation. A first photoresist layer (not shown) is formed on the sacrificial oxide layer 201, and defines an n-well pattern or p-well pattern thereon after exposure and development. Taking the first photoresist layer as a mask, the substrate 200 is doped by ion implantation for forming a MOS well (not shown). The first photoresist layer is removed for forming a polysilicon layer on the sacrificial oxide layer 201. A second photoresist layer (not shown) is formed on the polysilicon layer, and defines a gate pattern after exposure and development. The polysilicon layer and the sacrificial oxide layer 201 are etched along the gate pattern to expose the substrate 200 for forming a polysilicon gate 202. Taking the polysilicon gate 202 as a mask, ion implantation is performed on the substrate 200 for forming a light dopant region 203.

Figure 17:
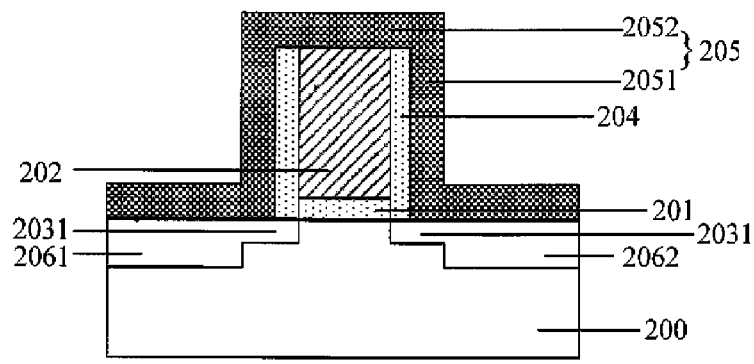

With reference to FIG. 17, a stop layer 205 is formed on the substrate 200 and covers the silicon oxide layer 204 and the polysilicon gate 202. The stop layer 205 includes a first part 2052 of the stop layer 205 on the polysilicon gate 202, and a second part 2051 of the stop layer 205 on opposite sides of the polysilicon gate 202 and the silicon oxide layer 204. The second part 2051 of the stop layer 205 and the silicon oxide layer 204 constitute spacers. Ions are implanted into the substrate 200 and opposite sides of the polysilicon gate 202 for forming a source 2061, a drain 2062 and a lightly doped drain (LDD) 2031. The source 2061 and the drain 2062 are deeper than the LDD 2031.

In an exemplary embodiment, a silicon oxide layer 204 is formed on the substrate 200 by chemical vapor deposition for covering the polysilicon gate 202. The silicon oxide layer 204 is etched to expose the substrate 200. A stop layer 205 is formed on the substrate 200 by chemical vapor deposition and covers the silicon oxide layer 204 and the polysilicon gate 202. Ions are implanted into the substrate 200 and at opposite sides of the polysilicon gate 202, forming a source 2061, a drain 2062 and a lightly doped drain (LDD) 2031. The source 2061 and the drain 2062 are deeper than the LDD 2031.

In one embodiment, the stop layer 205 includes silicon nitride.

Figure 18:
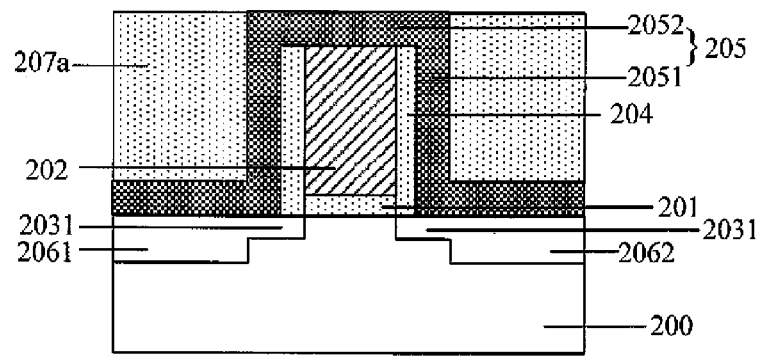

Referring to FIG. 18, a first interlayer dielectric layer 207a is formed on the stop layer 205, and is polished by CMP process to expose the first part 2052 of the stop layer 205.

In this embodiment, the first interlayer dielectric layer 207a includes the same material as that of the first embodiment, and the method for forming the first interlayer dielectric layer 207a is also the same as that of the first embodiment.

Figure 19:
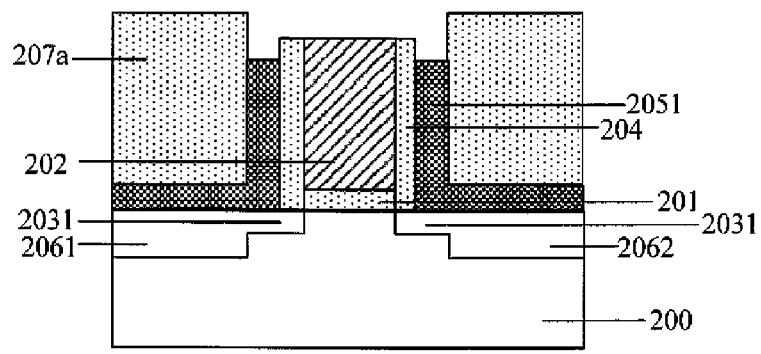

As shown in FIG. 19, the first part 2052 of the stop layer 205 on the spacers and the polysilicon gate 202 is removed. Further, a predetermined thickness of the second part 2051 of the stop layer 205 is removed. The predetermined thickness corresponds to thickness of the sacrificial oxide layer 201.

In the embodiment, the predetermined thickness of the second part 2051 of the stop layer 205 is removed by the same method as that of the first embodiment.

Figure 20:
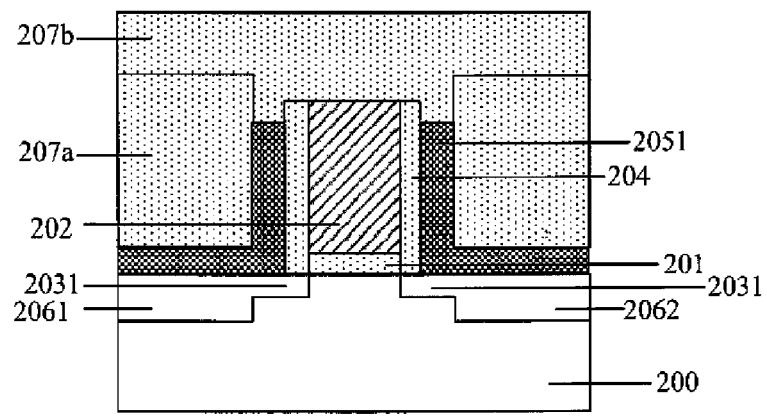

As shown in FIG. 20, a second interlayer dielectric layer 207b is formed on the first interlayer dielectric layer 207a, and covers the spacers and the polysilicon gate 202.

Figure 21:
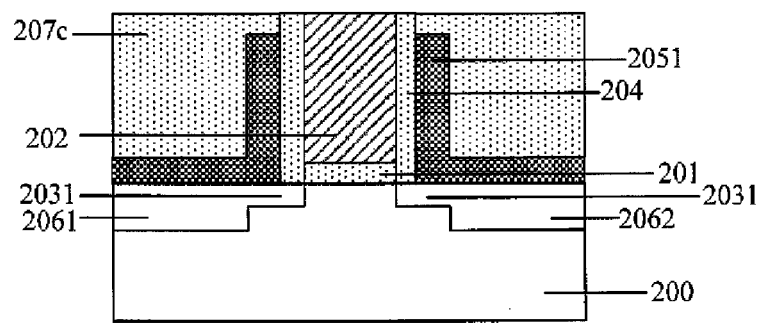

As shown in FIG. 21, the first interlayer dielectric layer 207a and the second interlayer dielectric layer 207b are polished by CMP process to expose the polysilicon gate 202 and forms a third interlayer dielectric layer 207c.

According to one embodiment, in the CMP process of polishing the first interlayer dielectric layer 207a and the second interlayer dielectric layer 207b, slurry has abrasive particles comprising, for example CeO2, MnO2, ZrO2, Al2O3 or SiO2, and the abrasive particles have diameter of 100-500 nanometers. Preferably, the slurry contains CeO2 with particle diameter ranged from 100-500 nanometers. The slurry containing CeO2 has characteristic of automatical stop on the polysilicon gate. After polishing, loss of the polysilicon gate is less than 50 Å.

Figure 22:
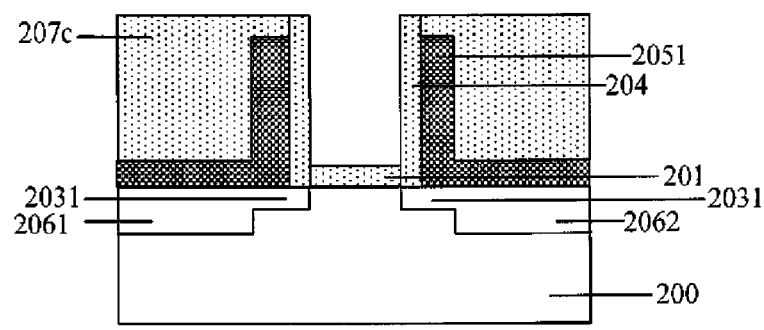

As shown in FIG. 22, the polysilicon gate 202 is removed to expose the sacrificial oxide layer 201 for forming a trench (not labeled).

In the embodiment, the polysilicon gate 202 is removed by dry etching.

Figure 23:
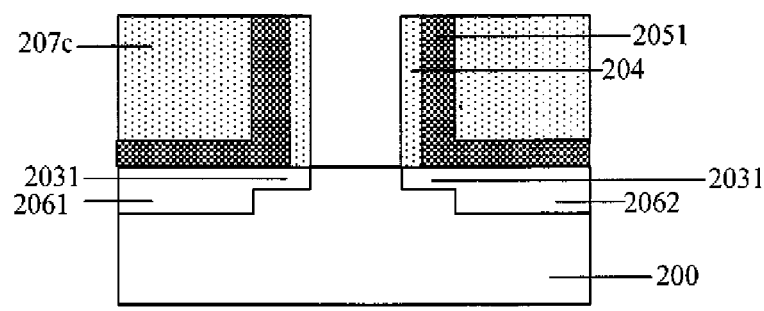

As shown in FIG. 23, the sacrificial oxide layer 201 in the trench is removed. The silicon oxide layer 204 in the spacers is substantially flush with the third interlayer dielectric layer 207c and the stop layer 2051 in the spacers.

In the embodiment, material of the sacrificial oxide layer 201 is the same as or similar to that of the silicon oxide layer 204 and the third interlayer dielectric layer 207c. Therefore, the silicon oxide layer 204 and the third interlayer dielectric layer 207c are respectively removed of the same thickness as that of the sacrificial oxide layer 201. When the sacrificial oxide layer 201 is removed, the silicon oxide layer 204 and the third interlayer dielectric layer 207c are substantially flush with the second part 2051 of the stop layer 205.

Figure 24:
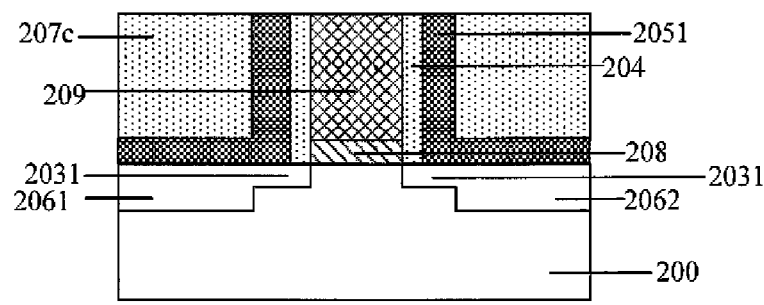

As shown in FIG. 24, a gate dielectric layer 208 and a metal gate 209 are formed in the trench. The method for forming the gate dielectric layer 208 and the metal gate 209 is the same as that of the first embodiment.

In the embodiment, the gate dielectric layer 208 includes high k material selected from at least one of HfSiO, HfZrO, HfLaO, HfO$_2$ and any combination thereof. The gate dielectric layer 208 is formed by CVD, LPCVD, PECVD or PVD.

In the embodiment, the metal gate 209 has material selected from at least one of aluminum, copper, nickel, chromium, tungsten, tungsten, titanium tungsten, tantalum, platinum nickel and any combination thereof. The metal gate 209 is formed by normal deposition process, for example CVD, LPCVD, PECVD or PVD.

In one embodiment, a diffusion stop layer (not shown) is formed after formation of the gate dielectric layer 208 for preventing from diffusion of the metal ions of the metal gate 209 into the third dielectric layer 207c. The diffusion stop layer includes TiN, TaN, TiAl or Ti.

In the embodiment, before removing the polysilicon gate 202, the first part 2052 of the stop layer 205 on the spacers and the polysilicon gate 202 is removed. Further, a predetermined thickness of the second part 2051 of the stop layer 205 is removed. The predetermined thickness is the same as thickness of the sacrificial oxide layer 201. The second interlayer dielectric layer 207b is formed on the first interlayer dielectric layer 207a, and covers the spacers and the polysilicon gate 202. The first interlayer dielectric layer 207a and the second interlayer dielectric layer 207b are polished by CMP process to expose the polysilicon gate 202 and form a third interlayer dielectric layer 207c. The sacrificial oxide layer 201 and the polysilicon gate 202 are removed, and the third interlayer dielectric layer 207c are substantially flush with the second part 2051 of the stop layer 205 and the silicon oxide layer 204. In a subsequent process, the metal layer is polished by CMP process to form a metal gate. The metal layer is not remained in the interlayer dielectric layer. Recesses in the stop layer and the silicon oxide layer, and therefore the metal layer remained in the recesses, are avoided. Correspondingly, shortcut is avoided effectively, and electric performance and reliability is promoted. Moreover, the process of etching the stop layer 2052, the process of forming the second dielectric layer 207b and the process of forming the third interlayer dielectric layer 207c are conveniently introduced into the normal processes without excessive variation.

The invention is disclosed, but not limited, by preferred embodiment as above. Based on the disclosure of the invention, those skilled in the art shall make any variation and modification without deviation from the scope of the invention. Therefore, any simple modification, variation and polishing based on the embodiments described herein belongs to the scope of the invention.

What is claimed is:

1. A method for forming a metal gate, comprising:
   providing a substrate;
   forming a sacrificial oxide layer and a polysilicon gate respectively on the substrate in sequence;
   forming a silicon oxide layer on sidewalls of the sacrificial oxide layer and the polysilicon gate;
   forming a stop layer that covers the substrate, the silicon oxide layer and the polysilicon gate, the stop layer having a first part parallel to the substrate, said first part being on the silicon oxide layer and the polysilicon gate, and a second part on the sidewalls of the silicon oxide layer, the second part of the stop layer and the silicon oxide layer together constituting spacers;
   forming a first interlayer dielectric layer on the stop layer that covers the spacers and the polysilicon gate;
   polishing the first interlayer dielectric layer for exposing the stop layer;
   removing the first part of the stop layer on the spacers and the polysilicon gate;
   removing a predetermined thickness of the second part of the stop layer in the spacers, the predetermined thickness corresponding to thickness of the sacrificial oxide layer;
   forming a second interlayer dielectric layer that covers the first interlayer dielectric layer, the spacers and the polysilicon gate;

polishing the second interlayer dielectric layer to expose the spacers and the polysilicon gate so as to form a third interlayer dielectric layer which comprises the first interlayer dielectric layer and the residual second interlayer dielectric layer, the third interlayer dielectric layer being substantially flush with the silicon oxide layer and the polysilicon gate;

removing the polysilicon gate to form a trench;

removing the sacrificial oxide layer in the trench, a portion of the third interlayer dielectric layer and a portion of the silicon oxide layer so that the residual third interlayer dielectric layer and the residual silicon oxide layer are substantially flush with the stop layer in the spacers; and forming a metal gate in the trench.

2. The method according to claim 1, wherein the first interlayer dielectric layer, the second interlayer dielectric layer and the third interlayer dielectric layer are polished by a CMP process.

3. The method according to claim 2, wherein a slurry used in the CMP process comprises $CeO_2$, $MnO_2$, $ZrO_2$, $Al_2O_3$ or $SiO_2$.

4. The method according to claim 1, wherein the predetermined thickness of the second part of the stop layer is removed by dry etching or wet etching.

5. The method according to claim 1, wherein the stop layer comprises silicon nitride.

6. The method according to claim 4, wherein in the wet etching, thick phosphoric acid has 85% concentration, etch rate is ranged of 500 Å/min-1500 Å/min, and removal rate ratio of the silicon nitride relative to the silicon oxide is larger than 50:1.

7. The method according to claim 4, wherein gases in dry etching comprise H, F and C.

8. The method according to claim 7, wherein the gases comprise at least one of $CHF_3$, $CH_2F_2$ and $CH_3F$, etching rate is ranged of 100 Å/min-500 Å/min, and removal rate ratio of the silicon nitride relative to the silicon oxide is ranged from 3:1 to 6:1.

9. The method according to claim 1, wherein the first interlayer dielectric layer and the second interlayer dielectric layer are formed with comprise oxide containing silicon.

10. The method according to claim 1, wherein the first interlayer dielectric layer and the second interlayer dielectric layer are formed by high density plasma (HDP) growth or high aspect ratio process (HARP) growth.

11. The method according to claim 1, wherein the sacrificial oxide layer comprises oxide containing silicon.

12. The method according to claim 11, wherein the sacrificial oxide layer is formed by tube hot oxidation.

13. The method according to claim 1, wherein the metal layer has material selected from at least one of aluminum, copper, nickel, chromium, tungsten, tungsten, titanium tungsten, tantalum, platinum nickel and any combination thereof.

14. The method according to claim 1, further comprising: before forming a metal gate, forming a gate dielectric layer on the substrate in the trench by a CMP process.

15. The method according to claim 14, wherein the gate dielectric layer comprises high k material.

16. The method according to claim 15, wherein the high k material of the gate dielectric layer comprises at least one of HfSiO, HfZrO, HfLaO, $HfO_2$ and any combination thereof.

17. A method for forming a MOS transistor, comprising: providing a substrate;

forming a sacrificial oxide layer and a polysilicon gate respectively on the substrate in sequence;

forming a silicon oxide layer on sidewalls of the sacrificial oxide layer and the polysilicon gate;

forming a stop layer that covers the substrate, the silicon oxide layer and the polysilicon gate, and having a first part parallel to the substrate, said first part being on the silicon oxide layer and the polysilicon gate, and a second part on the sidewalls of the silicone oxide layer, the second part of the stop layer and the silicon oxide layer constituting spacers;

forming a source in the substrate at one of the spacers and a drain in the substrate at another of the spacers;

forming a first interlayer dielectric layer on the stop layer for covering the spacers and the polysilicon gate;

polishing the first interlayer dielectric layer for exposing the stop layer;

removing the first part of the stop layer on the spacers and the polysilicon gate;

removing a predetermined thickness of the second part of the stop layer in the spacers, the predetermined thickness corresponding to thickness of the sacrificial oxide layer;

forming a second interlayer dielectric layer that covers the first interlayer dielectric layer, the spacers and the polysilicon gate;

polishing the second interlayer dielectric layer to expose the spacers and the polysilicon gate so as to form a third interlayer dielectric layer which comprises the first interlayer dielectric layer and the residual second interlayer dielectric layer, the third interlayer dielectric layer being substantially flush with the silicon oxide layer and the polysilicon gate;

removing the polysilicon gate to form a trench;

removing the sacrificial oxide layer in the trench, a portion of the third interlayer dielectric layer and a portion of the silicon oxide layer so that the residual third interlayer dielectric layer and the residual silicon oxide layer are substantially flush with the stop layer in the spacers; and forming a metal gate in the trench.

18. The method according to claim 17, wherein the first interlayer dielectric layer, the second interlayer dielectric layer and the third interlayer dielectric layer are polished by a CMP process.

19. The method according to claim 18, wherein a slurry used in the CMP process contains at least one of CeO2, MnO2, ZrO2, Al2O3 or SiO2.

* * * * *